United States Patent
Nishida et al.

(10) Patent No.: US 8,481,844 B2
(45) Date of Patent: Jul. 9, 2013

(54) SOLAR CELL AND SOLAR CELL MODULE

(75) Inventors: Toyozo Nishida, Moriguchi (JP); Shigeharu Taira, Moriguchi (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 562 days.

(21) Appl. No.: 11/959,548

(22) Filed: Dec. 19, 2007

(65) Prior Publication Data

US 2008/0149161 A1    Jun. 26, 2008

(30) Foreign Application Priority Data

Dec. 25, 2006  (JP) ................................ 2006-347809

(51) Int. Cl.
*H01L 31/042*    (2006.01)

(52) U.S. Cl.
USPC ........... 136/244; 136/243; 136/252; 136/256; 257/448; 257/459

(58) Field of Classification Search
USPC ....................................................... 136/244
See application file for complete search history.

(56) References Cited

U.S. PATENT DOCUMENTS

| | | | |
|---|---|---|---|
| 4,916,503 A | 4/1990 | Uematsu et al. | |
| 6,414,235 B1 * | 7/2002 | Luch | 136/244 |
| 6,573,445 B1 * | 6/2003 | Burgers | 136/256 |

FOREIGN PATENT DOCUMENTS

| | | |
|---|---|---|
| EP | 0 179 556 A2 | 4/1986 |
| JP | 04-48660 A | 2/1992 |
| JP | 2001-291879 A | 10/2001 |
| JP | 2002-530894 A | 9/2002 |
| JP | 2003-338631 | 11/2003 |
| JP | 2004-119687 A1 | 4/2004 |

OTHER PUBLICATIONS

Machine translation JP2001-291879 (May 21, 2009).*
Search Report issued on Apr. 24, 2008 in the counterpart European application.
Official Action issued on Jul. 15, 2008 in the counterpart Japanese application.

* cited by examiner

*Primary Examiner* — Jennifer Michener
*Assistant Examiner* — Matthew Martin
(74) *Attorney, Agent, or Firm* — Marvin A. Motsenbocker; Mots Law, PLLC

(57) ABSTRACT

In the solar cell module 1, one finger electrode 30 is branched into multiple branched portions 30a in an intersecting region α where the one finger electrode 30 intersects a conductive body including a wiring member 40 configured to collect photo-generated carriers from the finger electrode 30.

6 Claims, 7 Drawing Sheets

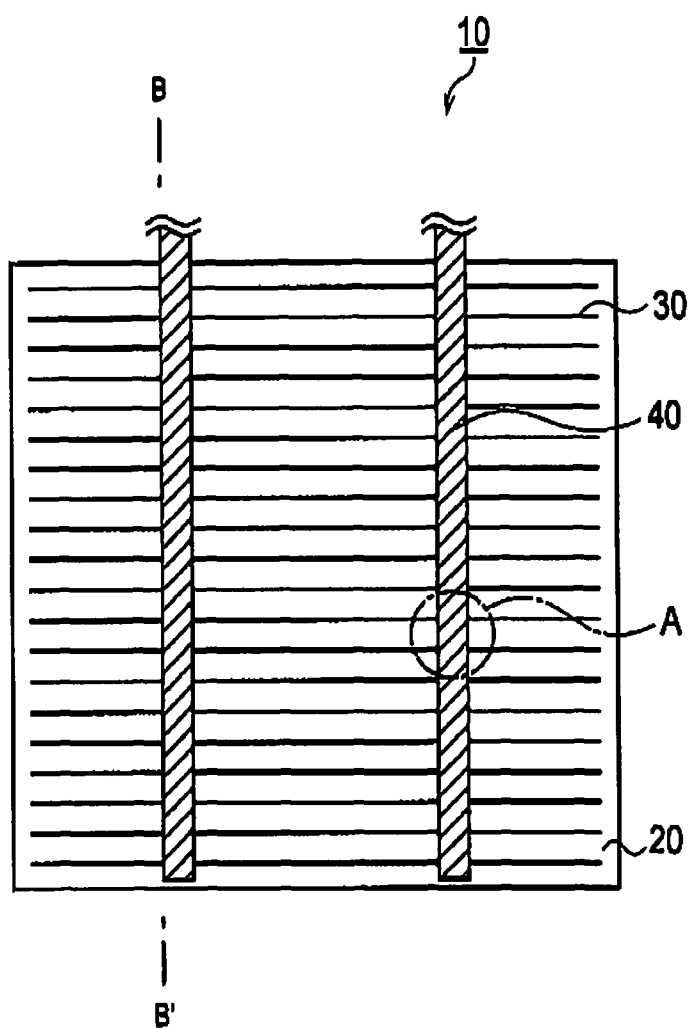

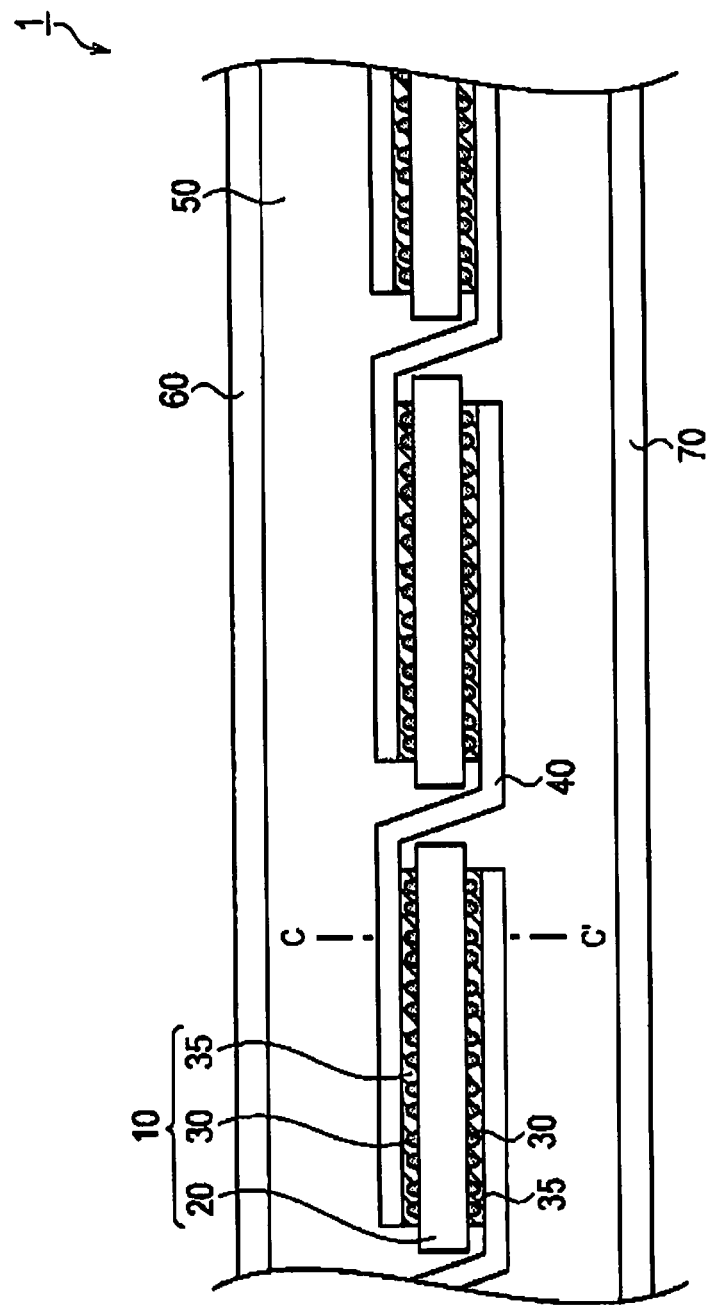

US 8,481,844 B2

SOLAR CELL AND SOLAR CELL MODULE

CROSS REFERENCE TO RELATED APPLICATIONS

This application is based upon and claims the benefit of priority from prior Japanese Patent Application No. 2006-347809, filed on Dec. 25, 2006; the entire contents of which are incorporated herein by reference.

BACKGROUND OF THE INVENTION

1. Field of the Invention

The present invention relates to a solar cell provided with a photoelectric conversion part as well as a plurality of finger electrodes formed on the photoelectric conversion part, and to a solar cell module provided with a plurality of solar cells, which are electrically connected to one another by wiring members, between a front surface protective member and a back surface protective member.

2. Description of the Related Art

Recently, in the field of solar cell modules, techniques to further improve the efficiency of the electric output per unit area have been vigorously developed.

A conventional solar cell module is provided with a plurality of solar cells, which are electrically connected to one another by wiring members, between a front surface protective member and a back surface protective member. The solar cell is provided with a photoelectric conversion part as well as a plurality of finger electrodes formed on the photoelectric conversion part. FIG. 1 is a top view of a conventional solar cell 10.

In general, an electric output of a solar cell module is proportional to a light-receiving area thereof. In other words, when the light-receiving area of the solar cell module becomes larger, a larger electric output can be obtained.

Accordingly, the electric output of the solar cell module can be made larger by setting a width of each of finger electrode 30 formed on a photoelectric conversion part 20 to be smaller, and by thus reducing areas that block incident light.

Here, linear expansion coefficient of materials for the photoelectric conversion part 20, that for, the finger electrode 30, and that for a wiring member 40 are different from one another. For this reason, stress occurs, between the materials, in an intersecting region α where the finger electrode 30 and the wiring member 40 intersect each other, due to temperature changes at the time when the wiring member 40 is soldered on the solar cell 10. In addition, such stress may also occur, between the materials, due to temperature changes in an actual use environment.

Thus, when a width of the finger electrode 30 is made smaller to increase the electric output of the solar cell module, the possibility of causing disconnection of the finger electrode 30 becomes higher due to the stress in the intersecting region α. FIG. 2A is an enlarged view of portion A in FIG. 1.

In order to avoid the disconnection of the finger electrode 30, as shown in FIGS. 2B and 2C, it is possible that the finger electrode 30 is made wider at a root portion of the intersecting region α (for example, see Japanese Patent Application Laid-open Publication No. 2003-338631).

SUMMARY OF THE INVENTION

A first aspect of the present invention provides a solar cell which is electrically connected to another solar cell by a wiring member. The solar cell includes: a photoelectric conversion part configured to collect photo-generated carriers generated by light incidence: and multiple finger electrodes which are formed on the photoelectric conversion part, and collect the photo-generated carrier from the photoelectric conversion part. In this solar cell, the finger electrode is branched into multiple branched portions in a region on which a conductive body including the wiring member is disposed, and a branching point of the branched portion is spaced from the the region on which the conductive body is disposed.

In the solar cell according to the first aspect of the present invention, one finger electrode is branched into multiple branched portions in an region on which a conductive body configured to collect photo-generated carriers from the finger electrode is disposed, and a branching point of each branched portion is spaced from the region on which the conductive body is disposed.

Accordingly, according to the solar cell of the first aspect of the present invention, even if one portion of the branched portions in one finger electrode is disconnected by stress due to temperature changes in the region on which the conductive body is disposed, the photo-generated carrier can be collected through the branched portion which is not disconnected. Thereby, deterioration of an electric output can be suppressed.

A second aspect of the present invention relates to the first aspect of the present invention. In the second aspect, the conductive body includes a bus-bar electrode configured to collect the photo-generated carrier from the multiple finger electrodes and the bus-bar electrode supports the wiring member.

A third aspect of the present invention relates to the first and second aspects of the present invention. In the third aspect, the branched portion is in contact with a branched portion of another finger electrode.

A fourth aspect of the present invention provides a solar cell module including multiple solar cells, which are electrically connected to one another by a wiring member, between a front surface protective member and a back surface protective member. The solar cell includes: a photoelectric conversion part configured to generate photo-generated carriers by light incidence; and multiple finger electrodes which are formed on the photoelectric conversion part, and collect the photo-generated carrier from the photoelectric conversion part. Each of the finger electrodes is branched into multiple branched portions in a region on which a conductive body including the wiring member is disposed, and a branching point of the branched portion is spaced from the region on which the conductive body is disposed.

A fifth aspect of the present invention relates to the fourth aspect of the present invention. In the fifth aspect, the conductive body is composed only of the wiring member and the wiring member collects the photo-generated carrier from the multiple finger electrodes.

A sixth aspect of the present invention relates to the fourth aspect of the present invention. In the sixth aspect, the conductive body is composed of a bus-bar electrode configured to collect the photo-generated carrier from the multiple finger electrodes and the wiring member, and the bus-bar electrode supports the wiring member.

A seventh aspect of the present invention relates to the fourth aspect of the present invention. In the seventh aspect, the branched portion is in contact with a branched portion of another finger electrode.

EFFECTS OF THE INVENTION

The present invention can provide a solar cell and a solar cell module, which are capable of suppressing deterioration of an electric output even if a finger electrode is disconnected.

BRIEF DESCRIPTION OF THE DRAWINGS

FIG. 1 is a schematic top view of a conventional solar cell 10;

FIG. 3 is a cross-sectional view of a solar cell module according to a first embodiment;

Figure 2A:
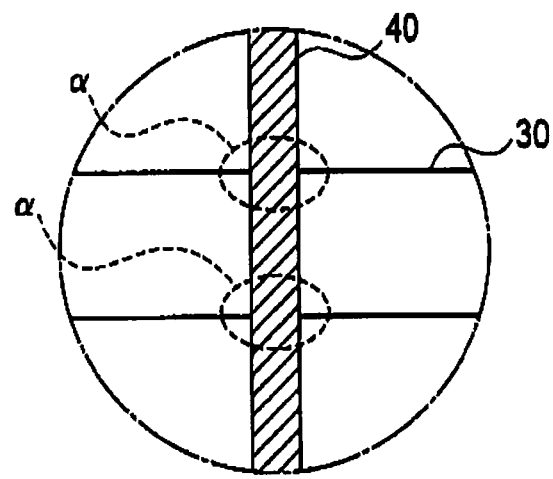
FIGS. 2A to 2C are enlarged top views of the conventional solar cell 10.

DESCRIPTION OF THE PREFERRED EMBODIMENTS (First Embodiment)

Next, a first embodiment of the present invention will be described with reference to the drawings. Note that the same or similar reference numerals are given to denote the same or similar portions in the drawings. In addition, the drawings are merely schematically shown and proportions of sizes and the like are different from actual ones. Thus, specific sizes and the like should be judged with reference to the description below. Moreover, it is a matter of course that some drawings have parts different from one another in size or ratio.

(Schematic Configuration of a Solar Cell Module 1)

FIG. 3 is a cross-sectional view of a solar cell module 1 according to the present embodiment. The cross-section of a solar cell 10 is a cross-section taken along the B-B' line in FIG. 1. However, since the schematic top view of the solar cell 10 according to the present embodiment and FIG. 1 are similar, the description will be given with reference to FIG. 1 when needed.

The solar cell module 1 according to the present embodiment is composed of: a plurality of solar cells 10; wiring members 40; a sealing member 50; a front surface protective member 60; and a back surface protective member 70. The solar cell module 1 is provided with the plurality of solar cells 10, which is electrically connected to one another by a pair of wiring members 40, between the front surface protective member 60 and the back surface protective member 70.

The solar cell 10 is composed of: the photoelectric conversion part 20; the plurality of finger electrodes 30; and a pair of bus-bar electrodes 35. The detailed description of the solar cell 10 will be given later.

Each of the pair of wiring members 40 is formed of a conductive material, such as copper, in the form of a thin sheet or a twisted line. One wiring member 40 is connected through solders or the like with one bus-bar electrode 35 formed on an acceptance surface of one solar cell 10 and another bus-bar electrode 35 provided on a back surface of another solar cell 10 adjacent to the one solar cell 10. In the present embodiment, a "conductive body" of the present invention includes the bus-bar electrode 35 and the wiring member 40. The wiring member 40 is supported by the bus-bar electrodes 35. Thereby, one solar cell 10 and another solar cell 10 adjacent to the one solar cell 10 are electrically connected.

The sealing member 50 seals the plurality of solar cells 10 that are electrically connected to one another by the wiring members 40. As the sealing member 50, a translucent resin, such as EVA, EEA, PVB, silicon, urethane, acryl, or epoxy can be used.

The front surface protective member 60 is disposed on the acceptance surface side of the sealing member 50. As the front surface protective member 60, a translucent and water blocking glass, a translucent plastic, or the like can be used.

The back surface protective member 70 is disposed on the back surface side of the sealing member 50. As the back surface protective member 70, a resin film, such as PET (polyethylene terephthalate), a laminated film with a structure in which an aluminum foil is sandwiched between resin films, or the like can be used.

The solar cell module 1 is composed in the above manner. In addition, an Al frame (not shown) may be attached around the solar cell module 1 in order to improve strength of the solar cell module 1 as a module, and thus to securely attach a pedestal thereto.

(Configuration of the Solar Cell 10)

The solar cell 10 is composed of: a photoelectric conversion part 20; the plurality of finger electrodes 30; and the pair of bus-bar electrodes 35.

The photoelectric conversion part 20 generates photo-generated carriers by light incidence from the acceptance surface above which the front surface protective member 60 is disposed. The photo-generated carriers mean positive holes and electrons, which are generated due to the absorption of incident light by the photoelectric conversion part 20. The photoelectric conversion part 20 has a semiconductive body junction, such as a pn junction or a pin junction. The photoelectric conversion part 20 can be formed of a semiconductive body material such as: a crystalline system semiconductive body material including single crystalline Si, polycrystalline Si, or the like; a thin-film semiconductive body material including an amorphous Si-based alloy, CuInSe, or the like; a compound semiconductive body material including GaAs, InP, or the like; and an organic metrical, such as a dye sensitization-type organic material.

The plurality of finger electrodes 30 is electrode configured to collect photo-generated carriers from the photoelectric conversion part 20. As shown in FIG. 3, the plurality of finger electrodes 30 according to the present embodiment is formed on substantially entire regions of the acceptance surface of the photoelectric conversion part 20 and the back surface (surface opposite to the acceptance surface) of the photoelectric conversion part 20 in the form of lines with a predetermined gap therebetween.

Note that the electrodes to be formed on the back surface of the photoelectric conversion part 20 may be formed so as to cover the entire back surface of the photoelectric conversion part 20. The present invention is not intended to limit the shape of the electrodes provided on the back surface of the photoelectric conversion part 20. In the present embodiment, as one example, the description will be given to a solar cell 10 provided with the plurality of finger electrodes 30 even on the back surface of the photoelectric conversion part 20.

The pair of bus-bar electrodes 35 is electrode configured to collect photo-generated carriers from the plurality of finger electrodes 30. As shown in FIG. 3, the bus-bar electrode 35 according to the present embodiment is formed in the form of lines so as to intersect the plurality of finger electrodes 30. The number of the bus-bar electrode 35 is set to be a proper number by considering a size and resistance of the solar cell 10. The solar cell 10 according to the present embodiment is provided with two bus-bar electrodes 35.

Accordingly, in the present embodiment, the plurality of finger electrodes 30 and the pair of bus-bar electrodes 35 are formed on the acceptance surface and back surface of the photoelectric conversion part 20. Since intersecting regions α, where the finger electrode 30 and the bus-bar electrode 35 intersect one another, will be described in detail below.

Here, it is preferable that the finger electrode 30 and the bus-bar electrode 35 according to the present embodiment be formed of a conductive paste to be cured within a temperature range in which thermal damages to a semiconductive body layer in the photoelectric conversion part 20 are small. If the photoelectric conversion part 20 includes an amorphous semiconductive body layer, such a conductive paste may be formed of a resin-type conductive paste, in which a resin material is used as a binder and conductive particles, such as silver particles, are used as a filler.

The binder is a resin material whose main purpose is bonding. The binder is required to be superior in moisture resistance and heat resistance in order to maintain reliability. As such a binder, one kind of resin selected from the group consisting of an epoxy resin, an acryl resin, a polyimide resin, a phenol resin, a urethane resin, a silicon region and the like, or a mixture or copolymer of these resins, or the like, can be used.

The main purpose of the filler is to obtain electric conductivity. As such filler, one kind of metal particle selected from the group consisting of aluminum, nickel, tin, gold, and the like, or an alloy of these, can be used. In addition, the filler may be formed of at least one kind of inorganic oxide selected from the group consisting of alumina, silica, titanium oxide, glass and the like on which metal coating is carried out or may be formed of at least one kind of resin selected from the group consisting of an epoxy resin, an acryl resin, a polyimide resin, a phenol resin, a urethane resin, a silicon region and the like, or a mixture or copolymer of these resins, or the like on which metal coating is carried out.

Figure 4:
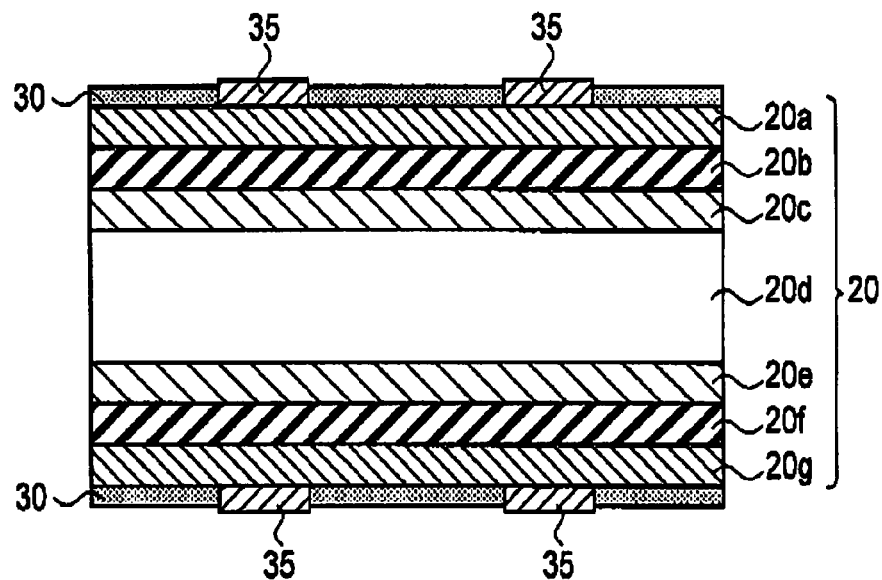
FIG. 4 is a cross-sectional view of a solar cell according to the first embodiment.

Next, the configuration of the solar cell 10 according to the present embodiment will be described as an example by paying attention to the configuration of the photoelectric conversion part 20. FIG. 4 is a cross-sectional view taken along the C-C' line in FIG. 3.

As shown in FIG. 4, the photoelectric conversion part 20 is provided with ITO films 20a and 20g, a p-type amorphous silicon layer 20b, i-type amorphous silicon layers 20c and 20e, an n-type single crystalline substrate 20d, and an n-type amorphous silicon layer 20f.

The p-type amorphous silicon layer 20b is formed on an acceptance surface of the n-type single crystalline silicon substrate 20d through the i-type amorphous silicon layer 20c. The ITO film 20a is formed on an acceptance surface of the p-type amorphous silicon layer 20b. On the other hand, the n-type amorphous silicon layer 20f is formed on a back surface of the n-type single crystalline silicon substrate 20d through the i-type amorphous silicon layer 20e. The ITO film 20g is formed on a back surface side of the n-type amorphous silicon layer 20f.

The finger electrode 30 and the bus-bar electrode 35 are formed on the acceptance surface of the ITO film 20a and the back surface of the ITO film 20g.

The solar cell module 1 having the solar cell 10 with the above-described configuration is referred to as an HIT solar cell module.

As shown in FIG. 31 the solar cell 10 having the above-described configuration is electrically connected to another solar cell 10 by the wiring member 40.

(Shape of the Finger Electrode 30 in the Intersecting region α)

Figure 5:
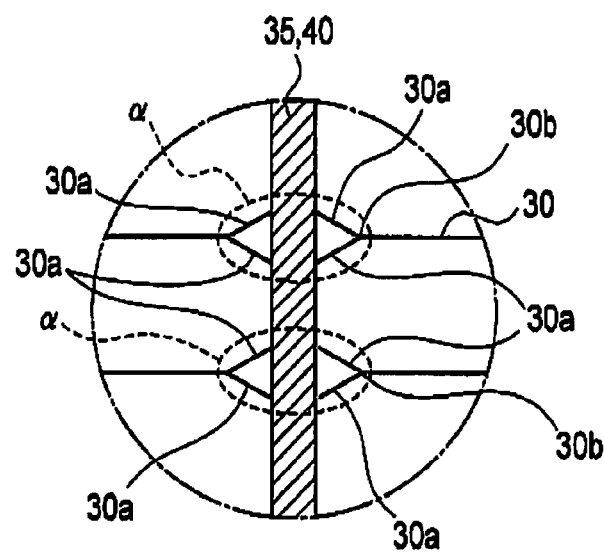
FIG. 5 is an enlarged top view of the solar cell according to the first embodiment.

With reference to FIG. 5, the shape of the finger electrode 30 in an intersecting region α where the finger electrode 30 intersects the bus-bar electrode 35 will be described. The intersecting region α is a region on which the conductive body including the bus-bar electrode 35 and the wiring member 40 is disposed. Note that also in the following description, FIG. 1 is referred to when needed.

In the solar cell 10 according to the present embodiment, as shown in FIGS. 1 and 5, the plurality of finger electrodes 30 and the pair of bus-bar electrodes 35 are formed on the acceptance and back surfaces of the photoelectric conversion part 20.

FIG. 5 is an enlarged view of portion A in FIG. 1. As shown in FIG. 5, one finger electrode 30 according to the present embodiment is branched into two branched portions 30a in the intersecting region α where the one finger electrode 30 intersects the bus-bar electrode 35. Each of the branched portions 30a is connected to the bus-bar electrode 35 supporting the wiring member 40. In addition, a branching point 30b of the two branched portions 30a is spaced from the bus-bar electrode 35. Therefore, the finger electrode 30 is branched into two branched portions 30a in the region on which the conductive body including the bus-bar electrode 35 and the wiring member 40 is disposed. The branching point 30b is spaced from the region on which the conductive body is disposed.

Note that the finger electrode 30 may be branched into at least three of plural branched portions 30a.

(Method for Manufacturing the Solar Cell Module 1)

A method for manufacturing the solar cell module 1 according to the present embodiment will be described. In the following description, FIGS. 3 and 4 will be referred to when needed.

The n-type single crystalline silicon substrate 20d is subjected to an anisotropic etching process with an alkaline solution, so that fine asperities are formed on the surface thereof. In addition, the surface of the n-type single crystalline silicon substrate 20d is cleaned to remove impurities therefrom.

Next, by use of a chemical vapor deposition method, such as a CVD method or the like, an i-type amorphous silicon layer 20c and a p-type amorphous silicon layer 20b are sequentially laminated on the acceptance surface of the n-type single crystalline silicon substrate 20d. Similarly, an i-type amorphous silicon layer 20e and an n-type amorphous silicon layer 20f are sequentially laminated on the back surface of the n-type single crystalline silicon substrate 20d.

Subsequently, by use of a sputtering method or the like, an ITO film 20g is formed on the acceptance surface of the p-type amorphous silicon substrate layer 20b. Similarly, an ITO film 20g is formed on the back surface of the n-type amorphous silicon layer 20f.

Thereafter, by use of a printing method, such as a screen printing method or an offset printing method, epoxy-based thermosetting silver paste is disposed in a predetermined pattern on the acceptance surface of the ITO film 20a. Similarly, the epoxy-based thermosetting silver paste is disposed in a predetermined pattern on the back surface of the ITO film 20g. The silver paste is heated under predetermined conditions to volatilize a solvent, and then is further heated to be completely set. Thereby, the plurality of finger electrodes 30 and the pair of bus-bar electrodes 35 are integrally formed on the photoelectric conversion part 20.

Here, the predetermined pattern that the plurality of finger electrodes 30 and the pair of bus-bar electrodes 35 are disposed is a comb shape in the present embodiment. In other words, the plurality of finger electrodes 30, disposed in the form of parallel lines with a predetermined gap therebetween, intersect the pair of bus-bar electrodes 35, disposed in the form of parallel lines with a predetermined gap therebetween. Furthermore, one finger electrode 30 is branched into multiple branched portions 30a in a region where the finger electrode 30 intersects the bus-bar electrode 35.

As described above, the solar cell 10 is manufactured.

Next, solders are melted by heat while the wiring member 40 is pressed onto the bus-bar electrode 35, so that an alloy layer of the bus-bar electrode 35 and the wiring member 40 is formed. Thereby, one solar cell 10 and another solar cell 10 adjacent to the one solar cell 10 are electrically connected.

Subsequently, an EVA (a sealing member 50) sheet, the plurality of solar cells 10 connected by the wiring members 40 to one another, an EVA (a sealing member 50) sheet, and a back surface protective member 70 are sequentially laminated on a glass substrate (a front surface protective member 60). Thereby, a laminated body is formed. The glass substrate, the EVA sheet, and the back surface protective member 70 have substantially the same outer size. Note that the back surface protective member 70 has a trilaminar structure of PET/aluminum/PET.

Thereafter, the laminated body is temporarily compression-bonded by carrying out thermal compression bonding in a vacuum atmosphere, and then is completely cured by heat under predetermined conditions.

As described above, the solar cell module 1 is manufactured.

Note that a terminal box, an Al frame, and the like can be attached to the solar cell module 1.

ADVANTAGEOUS EFFECTS

In the solar cell 10 provided in the solar cell module 1 according to the present embodiment, one finger electrode 30 is branched into multiple branched portions 30a in an intersecting region α where the one finger electrode 30 intersects a bus-bar electrode 35 configured to collect photo-generated carriers from the one finger electrode 30. In addition, each branched portion 30a is in contact with the bus-bar electrode 35, and a branching point 30b of each branched portion 30a is spaced from the bus-bar electrode 35.

Accordingly, even if some of the branched portions 30a in the one finger electrode 30 is disconnected by stress due to temperature changes in the intersecting region α, the photo-generated carriers can be collected through the branched portion 30a which is not disconnected. Thereby, deterioration of an electric output of the solar cell module 1 can be suppressed.

In addition, at the time when materials for the photoelectric conversion part 20 and the wiring member 40 are selected, the selection can be made from a large number of materials regardless of differences in coefficients of linear expansion.

(Second Embodiment)

Next, a second embodiment of the present invention will be described with reference to FIG. 6. Note that since the basic configuration and manufacturing method are the same as those of the first embodiment, portions different from the first embodiment will be described.

A solar cell 10 according to the present embodiment is not provided with a pair of bus-bar electrodes 35.

(Configuration of a Solar Cell Module 1)

The schematic top view of the solar cell 10 according to the present embodiment is similar to FIG. 1, and the enlarged view of portion A in FIG. 1 is similar to FIG. 5. However, since a pair of bus-bar electrodes 35 supporting a pair of wiring members 40 is absent, in the present embodiment, a "conductive body" of the present invention is formed only of the wiring member 40.

The wiring member 40 is directly connected through a conductive adhesive, such as a solder or a conductive resin, on an acceptance surface of a photoelectric conversion part 20 and back surface of a photoelectric conversion part 20 of another solar cell 10.

The plurality of finger electrodes 30 intersects the pair of wiring members 40 disposed on the photoelectric conversion part 20. In other words, as shown in FIG. 1, the plurality of finger electrodes 30 intersect the pair of wiring member 40 on the photoelectric conversion part 20. The pair of wiring members 40 directly collects photo-generated carriers from the plurality of finger electrodes 30.

The configuration of other portions is similar to that of the first embodiment.

(Configuration of a Finger Electrode 30 in an Intersecting Region α)

With reference to FIG. 6, the description will be given to the shapes of the finger electrode 30 in the intersecting regions α where the finger electrodes intersect the wiring member 40. The intersecting region α is a region on which the conductive body (the wiring member 40) is disposed.

One finger electrode 30 according to the present embodiment is branched into two branched portions 30a in an intersecting region α. Each branched portion 30a is electrically connected to the wiring member 40.

Figure 6A:
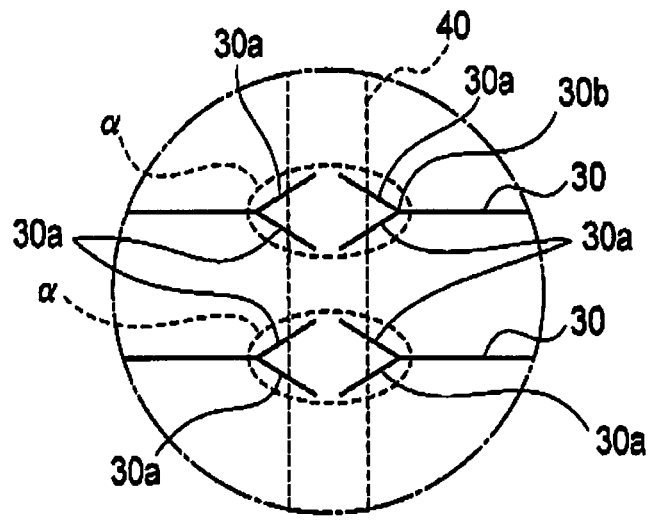
FIGS. 6A to 6C are enlarged top views of a solar cell according to a second embodiment.
Figure 6B:
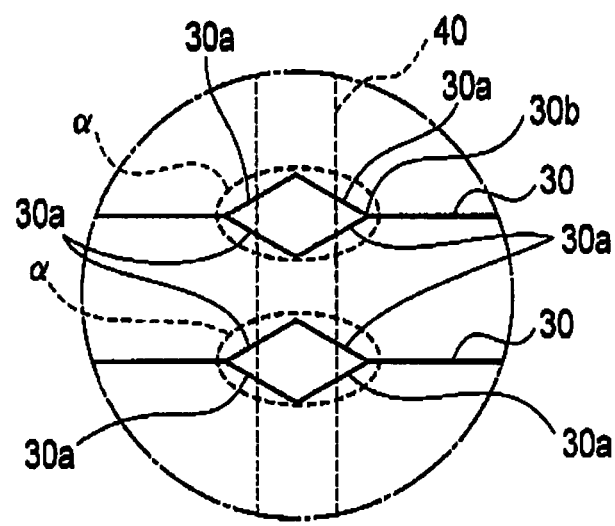
Figure 6C:
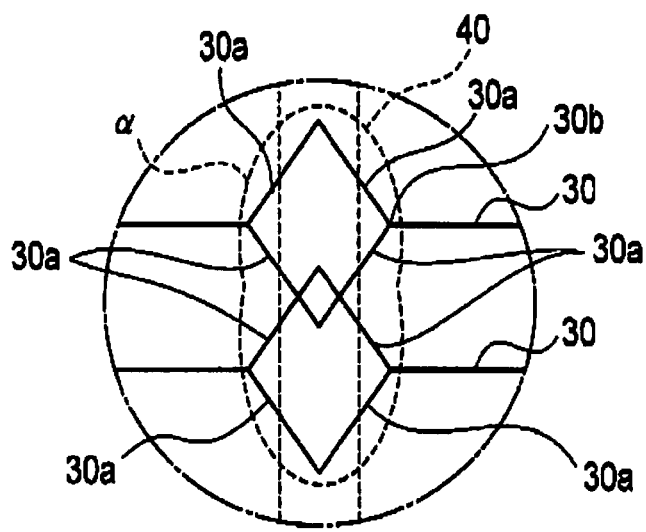

FIGS. 6A to 6C are enlarged views of portion A in FIG. 1. As shown in FIGS. 6A to 6C, branched portions 30a of one finger electrode 30 may be spaced from other branched portions 30a or may be in contact with one another. In particular, as shown in FIG. 6C, branched portions 30a of one finger electrode 30 may intersect other branched portions 30a of another finger electrode 30. Note that the finger electrode 30 may be branched into at least three of branched portions 30a in an intersecting region α.

In each of FIGS. 6A to 6C, a branching point 30b of each branched portion 30a is spaced from an intersecting region α.

Therefore, the finger electrode 30 is branched into two branched portions 30a in the region on which the conductive body (the wiring member 40) is disposed. The branching point 30b is spaced from the region on which the conductive body is disposed.

(Method for Manufacturing a Solar Cell Module 1)

In the first embodiment, the plurality of finger electrodes 30 and the pair of bus-bar electrodes 35 are placed on the photoelectric conversion part 20 by use of the printing method. In contrast, in the first embodiment, the pair of bus-bar electrodes 35 is not placed.

The plurality of finger electrodes (silver pastes) 30 according to the present embodiment are disposed in predetermined patterns shown in FIGS. 6A to 6C. Note that the shapes of the branched portions 30a are not limited, as long as one finger electrode 30 is branched into multiple branched portions 30a and each branched portion 30a is electrically connected to a wiring member 40.

After the finger electrodes 30 are printed, a conductive adhesive is melted or softened by heat while the wiring member 40 is pressed onto the photoelectric conversion part 20 through the conductive adhesive, in order to bond the photoelectric conversion part 20 and the wiring member 40.

Other processes are similar to those of the first embodiment.

ADVANTEGEOUS EFFECTS

In the solar cell module 1 provided with the solar cells 10 according to the present embodiment, one finger electrode 30 is branched into multiple branched portions 30a in an intersecting region α where the one finger electrode 30 intersects the wiring member 40 to collect photo-generated carriers from the finger electrode 30. In addition, each branched portion 30a is electrically connected to the wiring member 40, and a branching point 30b of each branched portion 30a is spaced from the intersecting region α.

Accordingly, even if some of the branched portions in one finger electrode 30 is disconnected by stress due to temperature changes in the intersecting region α, the photo-generated carriers can be collected through the branched portion 30a which is not disconnected. Thereby, deterioration of an electric output of the solar cell module 1 can be suppressed.

Furthermore, the solar cell module 1 provided with the solar cells 10 according to the present embodiment is not provided with a bus-bar electrode 35. Thus, the amount of the conductive paste to be used can be smaller. In other words, a manufacturing cost can be greatly reduced.

(Third Embodiment)

Next, a third embodiment of the present invention will be described with reference to FIGS. 7 and 8. Note that since the basic configuration and manufacturing method are the same as those of the first embodiment, portions different from the first embodiment will be described.

In the present embodiment, finger electrodes 30 are disposed in the form of lattice and bus-bar electrodes 35 are formed on intersecting points of the finger electrodes 30.

(Configuration of a Solar Cell Module 1)

Figure 7:
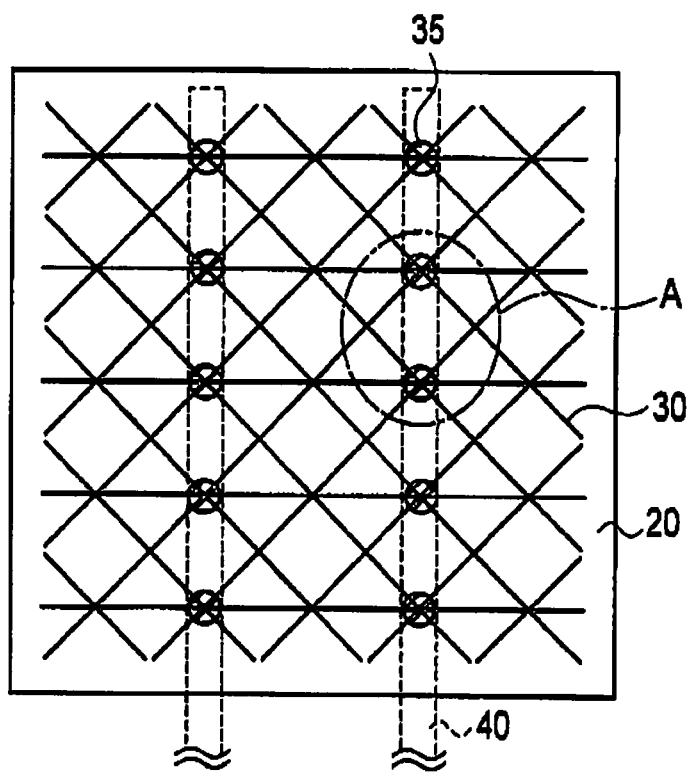
FIG. 7 is a schematic top view of a solar cell according to a third embodiment.

FIG. 7 is a schematic top view of a solar cell module 1 according to the present embodiment.

As shown in FIG. 7, finger electrodes 30 according to the present embodiment are formed in the form of lattice with a predetermined gap therebetween on the substantially entire acceptance surface and back surface of the photoelectric conversion part 20.

The bus-bar electrodes 35 are formed in a region where the wiring member 40 is disposed. The bus-bar electrodes 35 are formed on intersecting points of the finger electrodes 30 formed in the form of lattice. In other words, the bus-bar electrodes 35 are dotted in the form of nodes along a direction that the solar cells 10 are electrically connected to one another.

The wiring member 40 is disposed on the bus-bar electrodes 35 which are dotted in the form of nodes. Thus, the wiring member 40 is supported by the bus-bar electrodes 35 on the intersecting points of the finger electrodes and the bus-bar electrodes 35. In the present embodiment, a "conductive body" of the present invention is composed of the wiring member 40 and the bus-bar electrodes 35. In addition, portions where the wiring member 40 is not supported by the bus-bar electrodes 35 are directly disposed on the photoelectric conversion part 20.

The configuration of other portions is similar to that of the first embodiment.

(Configuration of the Finger Electrode 30 in the Intersecting Region α)

Figure 8A:
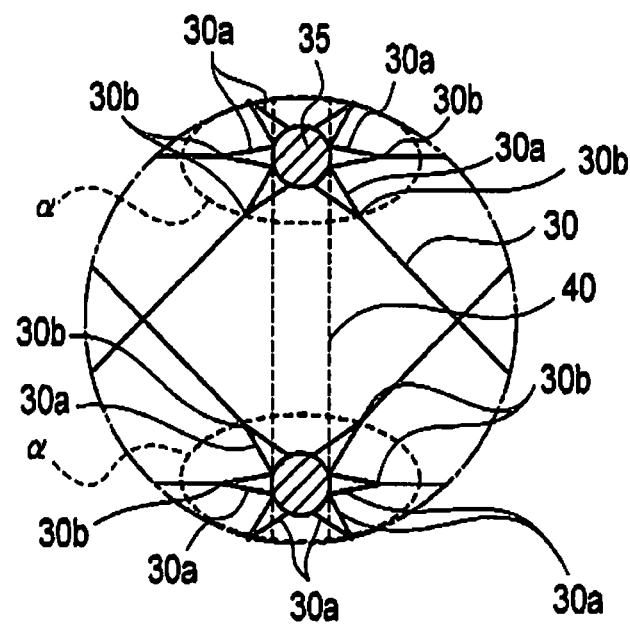
FIGS. 8A and 8B are enlarged top views of the solar cell according to the third embodiment.
Figure 8B:
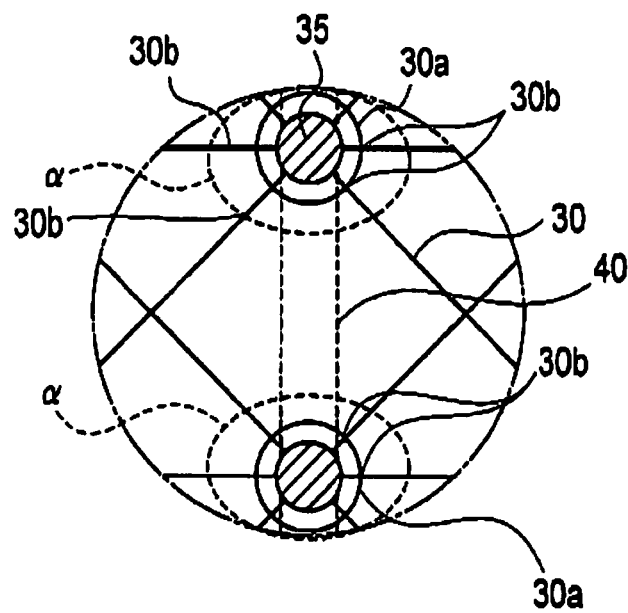

With reference to FIGS. 8A and 8B, shapes of the finger electrodes 30 in the intersecting regions α of the finger electrodes 30 and the bus-bar electrodes 35 will be described. The intersecting region α is a region on which the conductive body including the bus-bar electrode 35 and the wiring member 40 is disposed.

FIGS. 8A and 8B are enlarged views of portion A in FIG. 7. In FIG. 8A, one finger electrode 30 is branched into two branched portions 30a in an intersecting region α. Each branched portion 30a is in contact with a bus-bar electrode 35. The bus-bar electrode 35 supports the wiring member 40. In addition, a branching point 30b of each branched portion 30 is spaced from the bus-bar electrode 35. Therefore, the finger electrode 30 is branched into two branched portions 30a in the region on which the conductive body including the bus-bar electrode 35 and the wiring member 40 is disposed. The branching point 30b is spaced from the region on which the conductive body is disposed.

In FIG. 8B, one finger electrode 30 is branched into three branched portions 30a in an intersecting region α. Among the three branched portions 30a, one branched portion 30a is in contact with the bus-bar electrode 35 and two branched portions 30a are in contact with branched portions 30a of adjacent two finger electrodes 30. It is preferable that the two branched portions 30a are formed concentrically with the bus-bar electrode 35. Note that the two branched portions 30a which does not come in direct contact with the bus-bar electrode 35 may be formed in a circular shape or a polygonal shape close to a circular shape.

(Method for Manufacturing a Solar Cell Module 1)

A method for manufacturing a solar cell module 1 according to the present embodiment is different from that of the first embodiment in the pattern on which finger electrodes 30 and bus-bar electrodes 35 are printed.

The finger electrodes 30 are printed in the form of lattice, and the bus-bar electrodes 35 are printed in the form of nodes at intersecting points between the finger electrodes 35.

In addition, as shown in FIG. 8A, the finger electrodes 30 are printed so as to be branched into multiple branched portions 30a in intersections with the bus-bar electrodes 35. The branched portions 30a are printed so as to be in contact with the bus-bar electrodes 35. Here, as shown in FIG. 8B, the branched portions 30a may be in contact with branched portions 30a of another finger electrode 30 in a vicinity of the bus-bar electrodes 35.

After the finger electrodes 30 and the bus-bar electrodes 35 are printed, a conductive adhesive is melted or softened by heat while the wiring member 40 is pressed through the conductive adhesive along the bus-bar electrodes 35. Thereby, the bus-bar electrodes 35, the photoelectric conversion part 20, and the wiring member 40 are bonded.

Other processes are similar to those of the first embodiment.

ADVANTAGEOUS EFFECTS

In the solar cell module 1 provided with the solar cells 10 according to the present embodiment, each of the finger electrodes 30 is branched into multiple branched portions 30a in an intersecting region α where each finger electrode 30 intersects a bus-bar electrode 35. In addition, each branched portion 30a is in contact with the bus-bar electrode 35, and a branching point 30b of each branched portion 30a is spaced from the bus-bar electrode 35. Furthermore, it is preferable that the branched portions 30a be in contact with branched portions 30a of another finger electrode 30 in a vicinity of the bus-bar electrode 35.

According to such a solar cell module 1, even if some of the branched portions 30a in one finger electrode 30 is disconnected by stress due to temperature changes in the intersecting region α, the photo-generated carriers can be collected through the branched portion 30a which is not disconnected. Thereby, deterioration of an electric output of the solar cell module 1 can be suppressed.

Furthermore, if the branched portions 30a are in contact with branched portions 30a of another finger electrode 30, even if the branched portion 30a in contact with the bus-bar electrode 35 is disconnected, the photo-generated carriers can be collected by another finger electrode 30. In other words, the deterioration of the electric output of the solar cell module 1 can be further sufficiently suppressed.

(Other Embodiment)

The present invention has been described with reference to the foregoing embodiments. However, the description and drawings constituting one part of this disclosure should not be understood as to limit the present invention. For those skilled in the art, various alternative embodiments, examples, and operating techniques will be obvious.

For example, the shape of the branched portions 30a according to the above-described embodiments is not limited. It may be a curved or rectangular shape.

In addition, the solar cell 10 according to the above-described embodiments may have a pair of negative and positive electrodes on the back surface thereof.

Also, in the solar cell module 1 according to the above-described embodiments, not all of the finger electrodes 30 are needed to be branched into branched portions 30a. Even in this case, the finger electrode 30 having multiple branched portions 30a has an effect of the present invention.

Also, the solar cell module 1 according to the above-described embodiments may be a solar cell module using a crystalline system solar cell, or the like in which junctions are formed by a thermal diffusion method.

Also, the solar cell module 1 according to the above-described embodiments has been described in a case where the finger electrodes 30 intersect the conductive body (bus-bar electrodes 35 and the wiring member 40) in a comb form. However, each of the finger electrodes and the conductive body does not need to orthogonally intersect each other but may obliquely intersect each other.

As described above, it is a matter of course that the present invention incorporates various embodiments and the like which are not described herein. Hence, the technical scope of the present invention is defined only by items specifying the invention, which are according to the scope of claims reasonable from the above description.

EXAMPLE

The description of the solar cell module according to the present embodiment will be given in detail with reference to examples. However, the present invention is not limited to the following examples, and may be carried out by making various changes if needed without departing from the gist of the invention.

Examples

As a solar cell module according to an example of the present invention, a solar cell module 1 according to the first embodiment was manufactured.

An n-type single crystalline silicon substrate 20d with the thickness of 100 μm and the angle of 125 mm was subjected to an anisotropic etching process with an alkaline solution, so that fine asperities are formed on the surface thereof. In addition, a surface of the n-type single crystalline silicon substrate 20d is cleaned to remove impurities therefrom.

Next, by use of a RF plasma CVD method, an i-type amorphous silicon layer 20c with the thickness of 5 nm and a p-type amorphous silicon layer 20b with the thickness of 5 nm were sequentially laminated on an acceptance surface of the n-type single crystalline silicon substrate 20d. Similarly, an i-type amorphous silicon layer 20e with the thickness of 5 nm and an n-type amorphous silicon layer 20f with the thickness of 5 nm were sequentially laminated on the back surface of the n-type single crystalline silicon substrate 20d. Here, conditions for the RF plasma CVD method were a frequency of approximately 13.56 MHz, a forming temperature of approximately 200° C., a reaction pressure of approximately 30 Pa, and RF power of approximately 50 W.

Subsequently, by use of a magnetron sputtering method, an ITO film 20a with the thickness of 100 nm was formed on an acceptance surface of the p-type amorphous silicon layer 20b. Similarly, an ITO film 20g with the thickness of 100 nm was formed on a back surface of the n-type amorphous silicon layer 20f. Here, conditions for the magnetron sputtering method were a forming temperature of approximately 200° C., an Ar gas flow rate of approximately 200 sccm, an $O_2$ gas flow rate of approximately 50 sccm, power of approximately 3 kW, and magnetic field strength of approximately 500 Gauss.

Thereafter, by use of an offset printing method, epoxy-based thermosetting silver paste is disposed in a predetermined pattern on the acceptance surface and back surface of the ITO film 20a. The silver paste was heated at 150° C. for 5 minutes to volatilize a solvent, and then was further heated at 200° C. for one hour to be completely set. Thereby, 60 finger electrodes 30 each of which has the width of 50 μm and the pitch of 2 mm, and two bus-bar electrodes 35 each of which has the width of 2 mm, were integrally formed on the photo-electric conversion part 20. In particular, each of the finger electrodes 30 according to the present example is branched into two branched portions 30a in a region (intersecting region α) which is spaced by 5 mm from the bus-bar electrode 35.

As described above, the solar cell 10 was manufactured.

Next, one end of a solder-coated wiring member 40 with the width of 1.5 mm and the thickness of 200 μm was heated at 230° C. while pressed onto bus-bar electrodes 35 of one solar cell 10, thereby being connected with the bus-bar electrodes 35. Furthermore, the other end of the wiring member 40 was heated while pressed onto bus-bar electrodes 35 of another solar cell 10, thereby being connected with the bus-bar electrodes 35. Repeating these processes, multiple solar cells 10 were electrically connected to one another.

Subsequently, an EVA sheet, multiple solar cells 10, an EVA sheet, and a back surface protective member with a trilaminar structure of PET/aluminum/PET were sequentially laminated on a glass substrate. Thereby, a laminated body was formed. The glass substrate, the EVA sheet, and the back surface protective member have substantially the same outer size.

Thereafter, the laminated body was subjected to thermally compression bonding in a vacuum atmosphere at 150° C. for 10 minutes. Then, it was heated at 150° C. for one hour to be completely cured.

As described above, the solar cell module 1 according to the first embodiment was manufactured.

Conventional Example 1

As a conventional example 1, the solar cell module 1 shown in FIGS. 1 and 2A was manufactured. The finger electrodes 30 according the conventional example 1 are not branched in intersecting regions α where the finger electrodes 30 intersect the bus-bar electrodes 35. In other words, the finger electrodes 30 according to the conventional example are not provided with branched portions 30a.

Other processes are similar to those of the above-described embodiments.

Conventional Example 2

Figure 2B:
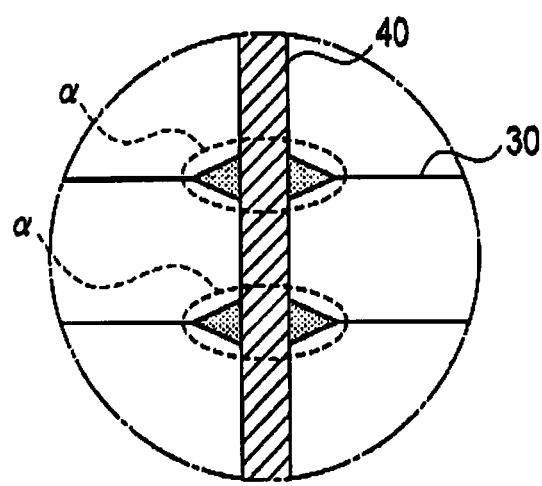
Figure 2C:
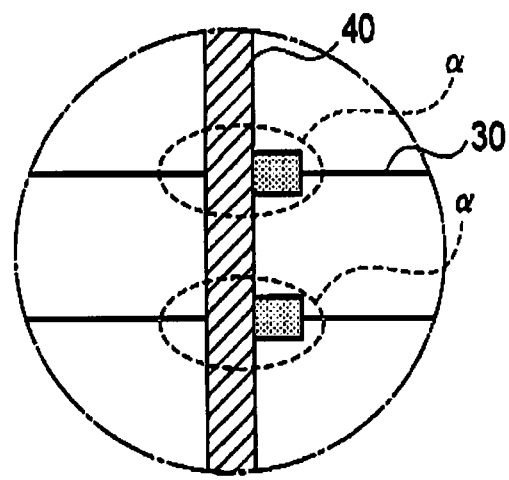

As a conventional example 2, the solar cell module 1 shown in FIGS. 1 and 2B was manufactured. The finger electrodes 30 according to the conventional example 2 were not branched in the intersecting regions α where the finger electrodes 30 intersect bus-bar electrodes 35. In other words, the finger electrodes 30 according to the conventional electrode 30 are not provided with branched portions 30a.

As shown in FIG. 2B, the finger electrode 30 according to the conventional example 2 formed triangles on both sides of the intersecting region α, having bus-bar electrodes 35 in the center thereof. The triangle was set to be an isosceles triangle with the base of 0.2 mm and the height of 5 mm, taking a side in contact with the bus-bar electrode 35 as a base.

Other processes are similar to those of the above-described embodiments.

(Temperature Cycle Test)

The temperature cycle test (JIS C8917) was carried out on each of the solar cell modules according to the embodiments and the conventional examples 1 and 2, so that output-decreasing rates of the solar cell modules were compared before and after the test.

In conformity with the JIS standards, the temperature cycle test was carried out continuously for 200 cycles by setting one cycle to have a temperature change from a high temperature (90° C.) to a low temperature (−40° C.), or form a low temperature to a high temperature. Note that the solar cell module was observed under the output of AM 1.5 and light irradiation of 100 mW/cm$^2$, and the output decreasing rate was calculated from the expression of (1−output after the test/output before the text)×100(%).

(Results)

When the output decreasing rates of the solar cell modules were compared, the output-decreasing rate of the solar cell module according to the embodiment of the present invention was suppressed by 0.8% lower than that of the conventional example 1, and by 0.4% lower than that of the conventional example 2.

In this manner, according to the solar cell module of the embodiments of the present invention, even if some of the branched portions 30a in one finger electrode 30 is disconnected by stress due to temperature changes in the intersecting region α, the photo-generated carriers can be collected through the branched portion 30a, which is not disconnected. Thereby, deterioration of an electric output of the solar cell module could be suppressed. In other words, it was confirmed that the solar cell module according to the present embodiments of the present invention could improve the reliability of the solar cell module.

(With Regard to an Electric Output)

The electric output of the solar cell module according to the embodiments was larger than that of the conventional examples 1 and 2.

This is attributable to: the fact that an area where light is blocked by the finger electrodes 30 in the embodiments (see, FIG. 5) was smaller than a light-blocked area of the conventional example 2 (see, FIG. 2B) on the acceptance surface of the solar cell module; and the fact that the deterioration of characteristics due to the disconnection of the finger electrodes 30, which occurs due to temperature changes when the wiring member 40 is connected, could be reduced in the solar cell module according to the embodiments. In other words, it was confirmed that the solar cell module according to the embodiment could obtain a larger electric output.

What is claimed is:

1. A solar cell which is electrically connected to another solar cell by a wiring member, comprising:
   a photoelectric conversion part configured to generate photo-generated carriers by light incidence; and
   a plurality of electrodes which is formed on the photoelectric conversion part, collects the photo-generated carriers from the photoelectric conversion part, and directly connects with the wiring member through a conductive adhesive;
   wherein electrodes are branched into a plurality of branched portions, a branched portion exists on each side of the wiring member and electrically connects to the wiring member,
   a branching point of the branched portion is spaced from the wiring member, and
   branched portions of electrodes on one side of a wiring member are continuous with branched portions of electrodes on the opposite side of the wiring member.

2. A solar cell module, comprising:
   a plurality of solar cells, which are electrically connected to one another by a wiring member, between a front surface protective member and a back surface protective member, wherein
   the solar cell includes a photoelectric conversion part configured to generate photo-generated carriers by light incidence, and
   a plurality of electrodes which is formed on the photoelectric conversion part, collects the photo-generated carriers from the photoelectric conversion part;
   electrodes are branched into a plurality of branched portions in a crossing region on which the wiring member and each of the electrodes is crossed,
   a branched portion exists on each side of the crossing region,
   branched portions of electrodes on one side of a wiring member are continuous with branched portions of electrodes on the opposite side of the wiring member; and
   a branching point of the branched portion is spaced from the crossing region.

3. The solar cell module according to claim 2, wherein a branched portion of one electrode is in contact with a branched portion of another electrode.

4. The solar cell module according to claim 1, wherein each electrode branches into two line portions and each of the two line portions electrically contacts the wiring member.

5. A solar cell which is electrically connected to another solar cell by a wiring member, comprising:
   a photoelectric conversion part configured to generate photo-generated carriers by light incidence; and
   a plurality of electrodes which is formed on the photoelectric conversion part, collects the photo-generated carriers from the photoelectric conversion part;
   wherein electrodes are branched into a plurality of branched portions in a crossing region on which the wiring member and each of the electrodes is crossed,
   branched portions of electrodes on one side of a wiring member are continuous with branched portions of electrodes on the opposite side of the wiring member, and
   a branching point of the branched portion is spaced from the crossing region on each of opposing sides of the wiring member.

6. A solar cell as described in claim 5, wherein the plurality of branched portions extend in transverse directions with respect to the wiring member.

\* \* \* \* \*